(12) United States Patent
Miyake et al.

(10) Patent No.: US 7,098,599 B2
(45) Date of Patent: Aug. 29, 2006

(54) PLASMA GENERATOR

(75) Inventors: Shoji Miyake, Suita (JP); Tatsuo Shoji, Nagoya (JP); Yuichi Setsuhara, Minoh (JP)

(73) Assignee: Japan Science & Technology Corporation, (JP)

( * ) Notice: Subject to any disclaimer, the term of this patent is extended or adjusted under 35 U.S.C. 154(b) by 168 days.

(21) Appl. No.: 10/250,385

(22) PCT Filed: Dec. 27, 2000

(86) PCT No.: PCT/JP00/09293

§ 371 (c)(1),
(2), (4) Date: Jun. 25, 2003

(87) PCT Pub. No.: WO02/056649

PCT Pub. Date: Jul. 18, 2002

(65) Prior Publication Data
US 2004/0027293 A1 Feb. 12, 2004

(51) Int. Cl.
*H01J 7/24* (2006.01)
*H01Q 1/26* (2006.01)

(52) U.S. Cl. .................... 315/111.21; 343/701
(58) Field of Classification Search ........... 343/701, 343/866; 376/123; 118/721, 345.4; 156/345.48; 315/111.21–81, 111.51, 111, 51
See application file for complete search history.

(56) References Cited

U.S. PATENT DOCUMENTS

| | | | | |
|---|---|---|---|---|
| 4,649,391 A | * | 3/1987 | Tsuda et al. ............. | 342/153 |
| 5,178,739 A | | 1/1993 | Barnes et al. | |
| 5,397,962 A | * | 3/1995 | Moslehi ................ | 315/111.51 |
| 5,522,934 A | | 6/1996 | Suzuki et al. | |
| 5,565,738 A | * | 10/1996 | Samukawa et al. ...... | 315/111.51 |
| 5,824,158 A | | 10/1998 | Takeuchi et al. | |
| 6,024,827 A | * | 2/2000 | Ishii ...................... | 156/345.48 |
| 6,033,481 A | * | 3/2000 | Yokogawa et al. ..... | 156/345.41 |
| 6,387,208 B1 | * | 5/2002 | Satoyoshi et al. ...... | 156/345.37 |
| 6,439,154 B1 | * | 8/2002 | Fukuda et al. ........... | 118/723 I |
| 6,499,424 B1 | * | 12/2002 | Kazumi et al. ......... | 118/723 R |
| 6,664,548 B1 | * | 12/2003 | Beneniste et al. ...... | 250/423 P |
| 6,694,915 B1 | * | 2/2004 | Holland et al. .......... | 118/723 I |
| 2002/0175869 A1 | * | 11/2002 | Wilcoxson et al. ........ | 343/742 |

FOREIGN PATENT DOCUMENTS

| | | |
|---|---|---|
| EP | 0 838 839 A2 | 4/1998 |
| JP | 5-507963 | 11/1993 |
| JP | 7-18433 | 1/1995 |
| JP | 7-45598 | 2/1995 |
| JP | 7-86191 | 3/1995 |
| JP | 7-201495 | 8/1995 |
| JP | 7-254500 | 10/1995 |
| JP | 7-263188 | 10/1995 |
| JP | 8-13169 | 1/1996 |
| JP | 8-81777 | 3/1996 |
| JP | 9-111460 | 4/1997 |

(Continued)

*Primary Examiner*—Tuyet Vo
*Assistant Examiner*—Hung Tran Vy
(74) *Attorney, Agent, or Firm*—McGlew & Tuttle, PC

(57) ABSTRACT

The whole antenna conductor is housed in the interior of a vacuum container of a plasma generator thereby to eliminate the need for an insulating partition or a top plate so that the whole induction field radiated from the antenna can be effectively utilized. Furthermore, the occurrence of abnormal discharge is suppressed to stabilize a high-density plasma by reducing the inductance of the antenna and covering the antenna conductor with an insulator.

5 Claims, 10 Drawing Sheets

FOREIGN PATENT DOCUMENTS

| | | |
|---|---|---|
| JP | 10-189293 | 7/1998 |
| JP | 10-233297 | 9/1998 |
| JP | 10-241897 | 9/1998 |
| JP | 11-135438 | 5/1999 |
| JP | 11-233289 * | 8/1999 |
| JP | 11-307299 | 11/1999 |
| JP | 2000-3878 | 1/2000 |
| JP | 2000-310697 | 11/2000 |
| JP | 2001-35697 | 2/2001 |

* cited by examiner

EVACUATION

PLASMA GENERATOR

TECHNICAL FIELD

This application is PCT/JP00/09293, this invention relates to a plasma generator and, more particularly, to a plasma generator useful for a plasma processing apparatus which generates a high-frequency electric field by supplying a high-frequency current to an antenna, generates a plasma by the electric field and performs surface processing, such as etching and thin-film forming, of a substrate surface and which is suitable for treating a large-area substrate such as a liquid crystal glass substrate.

BACKGROUND ART

In the field of processing apparatuses which use a plasma, such as dry etching apparatuses, ashing apparatuses and plasma CVD apparatuses, used in the manufacturing process of semiconductor devices and liquid crystal displays, plasma sources of the apparatuses are required to provide large-diameter design in association with the recent upsizing of substrates to be treated. Furthermore, on the other hand, high-density design of a plasma in a high vacuum is required in order to ensure etching rate, film forming rate and throughput.

For the high-density design of a plasma among these requirements, a method by which an inductively coupled plasma (hereinafter referred to as an ICP) is generated by use of a high-frequency wave is adopted in order to promote plasma excitation efficiency. An IPC is such that a high-frequency current is caused to flow mainly through an antenna excitation coil and an induction field is generated in a vacuum, with the result that a high-density plasma can be uniformly formed in a high vacuum.

An example of a conventional plasma processing apparatus which uses an ICP is shown in FIG. 14. In FIG. 14, the numeral 21 denotes a vacuum container (process chamber) which performs substrate etching processing etc., the numeral 22 an insulating partition of quartz etc. provided in part of the vacuum container, the numeral 23 a high-frequency antenna of a go-around shape which is provided in loop or spiral shape along the wall surface of the insulator wall 22 on the atmosphere side with one or more turns, the numeral 24 a high-frequency power source which supplies high-frequency power to the high-frequency antenna, the numeral 25 an exhaust opening, the numeral 26 a discharge chamber in which a discharge plasma is generated, and the numeral 27 a substrate electrode.

In the conventional method shown in FIG. 14, it is necessary to increase the wall thickness of the insulating partition 22 to a thickness which is as large as 10 to 30 mm in order to obtain mechanical strength necessary for resisting a pressure difference between the outside air under atmospheric pressure and the interior of the discharge chamber 26 in a high vacuum when the diameter of the discharge pressure is to be increased to not less than 400 mmφ. For this reason, the intensity of the induction field radiated from the high-frequency antenna 23 decreases exponentially with increasing distance from the antenna and the discharge efficiency worsens, with the result that the inductance of the antenna 23 increases, posing problems such as an increase in the high-frequency voltage occurring in the antenna.

On the other hand, instead of providing an antenna so as to go around like this on the side surface of the discharge chamber, there was available a method by which the top surface of the discharge chamber of the vacuum container is used as the top plate of the insulator and an antenna is provided outside the top plate. This method posed the problem that the required thickness of the insulator of the top plate is as large as 30 to 50 mm in order to ensure mechanical strength when the diameter of the discharge chamber is to be increased to not less than 400 mmφ, whereas the thickness of the insulator of the top plate is about 20 mm when the present discharge chamber diameter is 300 mmφ.

In the conventional inductively coupled plasma generator in which a high-frequency antenna is provided on the insulating partition of the vacuum container or on the wall surface on the top plate on the outside air side, the thickness of the insulator has to be substantially increased with increasing diameter of the discharge chamber. Besides, the conventional inductively coupled plasma generator posed the problem that the utilization efficiency of the high-frequency power which is input is low because only the induction field component radiated to the side of a face in contact with the insulating partition of the vacuum container or the top plate out of the entire induction field radiated from the antenna is utilized in maintaining the discharge.

The object of the present invention is to provide a plasma generator which generates, in a stable manner, a large-diameter, large-volume, high-density plasma which is not limited by the shape, diameter and length of a discharge chamber.

DISCLOSURE OF INVENTION

In order to solve the above-described problems, in a plasma generator of the present invention, the antenna itself is provided in an arbitrary position within the interior of the vacuum container, that is, the antenna is provided as an inner antenna in such a manner that the whole surface of the antenna is within the vacuum container thereby to ensure that all induction fields radiated from the antenna can be effectively utilized and that the need for using insulating partition and a top plate is eliminated. At the same time, in the present invention, the inductance of the antenna is minimized as far as possible and the antenna is configured in such a manner as not to extend in a go-around manner by at least one turn or more because in the case of an inner antenna, an abnormal discharge becomes apt to occur when a large voltage is applied. The principle of the present invention will be described below in detail.

When the antenna is introduced into the vacuum container, the antenna itself is exposed to a plasma and, therefore, ions and electrons flow to the antenna depending on the voltage applied to the antenna. At this time the moving speed of the ions and electrons in the plasma increase abnormally with respect to the high-frequency electromagnetic field. Therefore, effectively in terms of time average, the electrons in the plasma flow excessively into the antenna, leading to an increase in plasma potential. As a result, the increase in plasma potential due to an electrostatic coupling to the antenna conductor in association with an increased density of plasma caused by an increase in input high-frequency power becomes remarkable, causing an abnormal discharge in the vacuum container. Thus, an ICP plasma of the inner antenna type poses the problem that it is difficult to obtain a stable high-density plasma. Furthermore, an increase in electrostatic coupling increases the amplitude of the high-frequency voltage applied to a plasma from the antenna via a sheath. This increase in the amplitude of the high-frequency voltage induces a disturbance of the plasma (an increase in high-frequency variations of plasma potential).

As a result, fluctuations of a plasma during etching and thin-film forming increase (for example, an increase in ion entrance energy) and the effect of plasma damage is feared. Therefore, in the generation of an ICP plasma of the inner antenna type, it is important that the high-frequency voltage to be applied be lowered in the operating voltage. For this purpose, it is important to reduce the inductance of the antenna and to suppress electrostatic coupling.

For this reason, the plasma generator of the present invention is a plasma generator to generate inductive coupling plasma by high-frequency discharge, wherein an antenna which generates an induction field by applying high frequency power is provided within a vacuum container, and the above-described antenna is constituted by a ring-shaped multipole antenna.

Also, the plasma generator of the present invention is a plasma generator to generate inductive coupling plasma by high-frequency discharge, wherein an antenna which generates an induction field by applying high-frequency power is provided within a vacuum container, and the above-described antenna is constituted by a linear conductor which terminates without going around.

Also, the plasma generator of the present invention is a plasma generator to generate inductive coupling plasma by high-frequency discharge, wherein an antenna which generates an induction field by applying high-frequency power is provided within a vacuum container, the above-described antenna is constructed by at least one or more linear conductors disposed along an inner wall of the vacuum container, and a high-frequency current is supplied in parallel to each of these one or more linear conductors.

Also, the plasma generator of the present invention is a plasma generator to generate inductive coupling plasma by high-frequency discharge, wherein an antenna which generates an induction field by applying high-frequency power is provided within a vacuum container, the above-described antenna is constituted by a ring-shaped conductor, and a high-frequency current is supplied to the ring-shaped conductor between one point of the ring-shaped conductor and another point opposed to this one point on a diametrical line.

BEST MODE FOR CARRYING OUT THE INVENTION

The basic configuration of a plasma generator according to the present invention will be described below with reference to FIG. 1. Incidentally, although an apparatus of an embodiment of the present invention is shown in FIG. 1 for the sake of convenience, the present invention is not limited by this embodiment.

Figure 1:
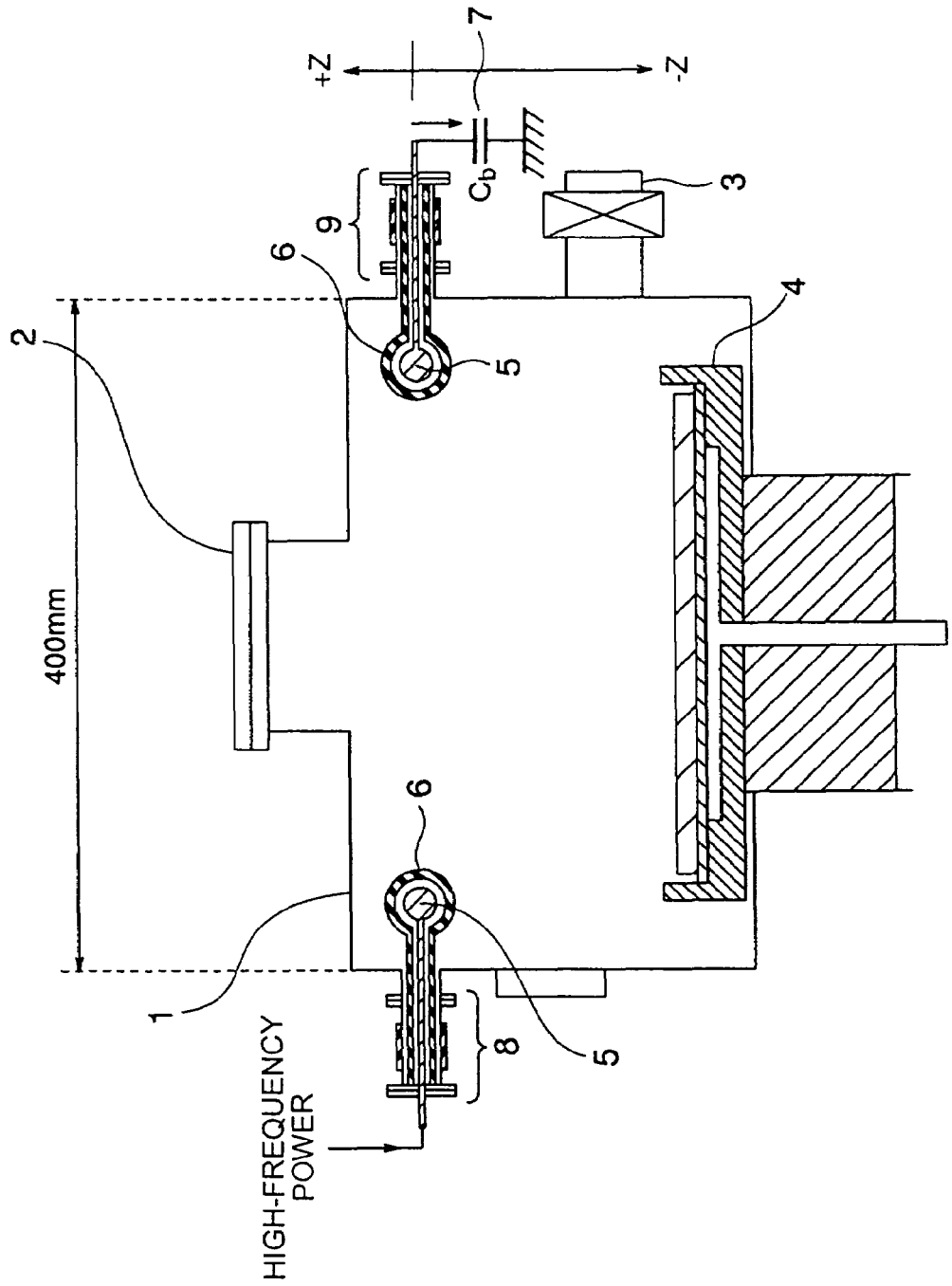
FIG. 1 is a view to explain the basic configuration of the present invention.

In FIG. 1, the numeral 1 denotes a vacuum container (a process chamber), the numeral 2 a top plate, the numeral 3 an exhaust opening, the numeral 4 a substrate electrode, the numeral 5 an antenna conductor according to the present invention, the numeral 6 an insulating tube covering the whole surface of the antenna conductor 5, the numeral 7 a blocking capacitor with fixed or variable capacity which causes the antenna conductor 5 to float from a ground, and the numerals 8, 9 introduction terminals which support the antenna conductor 5 and supply high-frequency (radio frequency) power to the antenna conductor 5.

Although only its section is shown in FIG. 1, the antenna conductor 5 is constituted by one or more linear conductors of various shapes, such as the shape of the letter Π and of a circular arc disposed along an inner surface of the vacuum container 1. All of these linear conductors are made with such a length that the linear conductors do not go around on the inner wall surface of the vacuum container 1, that is, they terminate without making a round on the inner wall surface. Concretely, patterns of antenna as shown in FIGS. 3, 10, 12 and 13 are applied.

Because the whole antenna for plasma excitation is housed within the interior of the vacuum container 1, it is unnecessary to form part of the vacuum container from a thick insulating material and this makes it easy to increase the diameter of the apparatus and the shape of the antenna can also be arbitrarily and easily changed.

Figure 2:
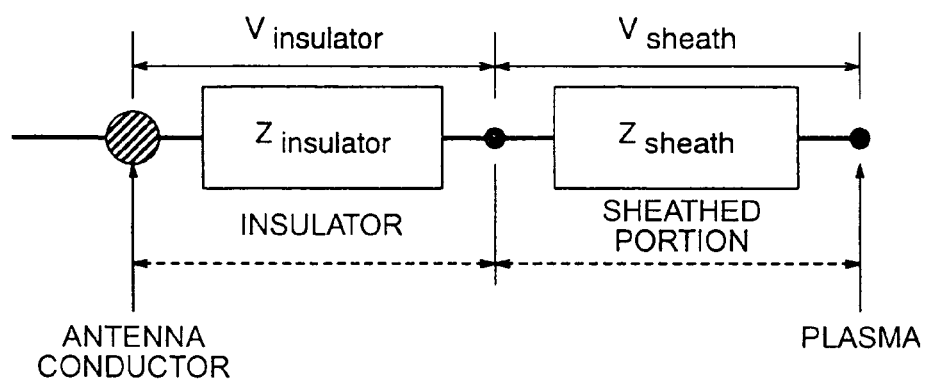
FIG. 2 is a schematic diagram of an equivalent circuit in a case where an antenna conductor is coated with an insulator.

As shown in FIG. 1, in a case where the whole surface of the antenna conductor 5 is covered with the insulating tube 6 within the vacuum container 1, the voltage applied to the sheath region of a plasma ($V_{sheath}$) can be expressed, as shown in the equivalent circuit diagram of FIG. 2, by the following equation by use of the voltage which occurs in the antenna ($V_{antenna}$) and the portion of voltage drop in the insulator ($V_{insulator}$):

$$V_{sheath} = V_{antenna} - V_{insulator} = V_{antenna} Z_{sheath} / (Z_{insulator} + Z_{sheath}) \qquad (1)$$

Where $Z_{insulator}$ and $Z_{sheath}$ denote the impedances of the insulator and sheath region, respectively. These impedances are mainly composed of a resistance component and an electrostatic capacity component. When plasma density is increased by an increase of high-frequency power, $Z_{sheath}$ decreases due to an increase in electrostatic capacity, which is due to a decrease in the equivalent resistance (a resistance component) in a plasma and a decrease in the thickness of the sheath (the electrostatic capacity of the sheath is in inverse proportion to the thickness of the sheath). (Because the electrostatic capacity component of the impedance is in reciprocal proportion to electrostatic capacity, an increase in the electrostatic capacity of the sheath contributes to a decrease in impedance.) In contrast to this, because $Z_{insulator}$ is constant regardless of the condition of a plasma, the higher the plasma density, the smaller the value of $V_{sheath}$. By covering the antenna surface with an insulator like this, the inflow of electrons into the antenna is blocked and the electrostatic coupling component of the antenna and plasma is suppressed. As a result, a rapid increase in plasma potential associated with an increase in the plasma density is suppressed and it becomes possible to generate a stable high-density plasma without causing an abnormal discharge. Furthermore, because the sheath potential decreases, the sputtering of the inner wall surface of the vacuum container and the antenna by the plasma is suppressed and impurities are prevented from getting mixed into the substrate surface and the thin film.

In the selection of the material and thickness of the insulator, it is important to provide an impedance which is sufficiently larger than the equivalent impedance of the sheath (for example, larger by an order of magnitude at least) ($Z_{insulator} >> Z_{sheath}$). Moreover it is necessary that heat resistance, chemical stability, mechanical strength, electrical insulating properties, etc. which do not pose any problems even when the insulator is directly exposed to a plasma be provided. Therefore, materials of the group of ceramic dielectrics which simultaneously satisfy high resistance, high insulating properties and low dielectric constants, such as high-purity alumina, quartz and zirconia, are used and it is necessary only that the thickness of these materials be about 2 to 4 mm.

Figure 3:
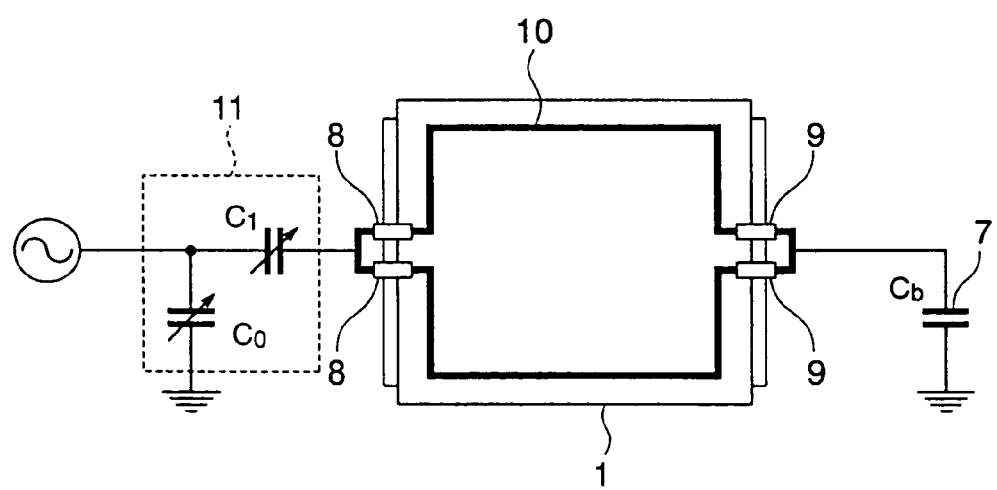
FIG. 3 is a configuration view of an example of the shape of an antenna which extends without going around.

FIG. 3 shows an example of the shape of an antenna which is caused to terminate so as to extend without going around. The high-frequency antenna 10 shown in the figure is an example of an antenna in which within a vacuum container 1 having a rectangular section, two antenna conductors which are caused to make a half round in the shape of the letter Π along the wall surface are opposed to each other and connected in parallel to form a rectangular frame similar to a section of the vacuum container. When the vacuum container 1 assumes a cylindrical shape, it is possible to use an antenna in which two semicircular patterns are opposed to each other in place of Π-shaped patterns and connected in parallel to form a circular frame. Incidentally, as required, it is also possible to use an antenna having a rectangular or circular frame in which a rectangle or circle is divided into three or more patterns, which are connected in parallel. In most cases where the plurality of conductors are provided within the inner wall surface of the vacuum container, the conductors as a whole are shorter than the length of the inner wall surface, as can be seen, for instance, in FIGS. 3, 10, and 11.

This high-frequency antenna 10 which extends without going around can substantially reduce the inductance which the coil has in comparison with conventional antennas of loop and coil having a go-around shape. As a result, an increase in high-frequency voltage associated with an increase in high-frequency power can be substantially suppressed.

Figure 4A:
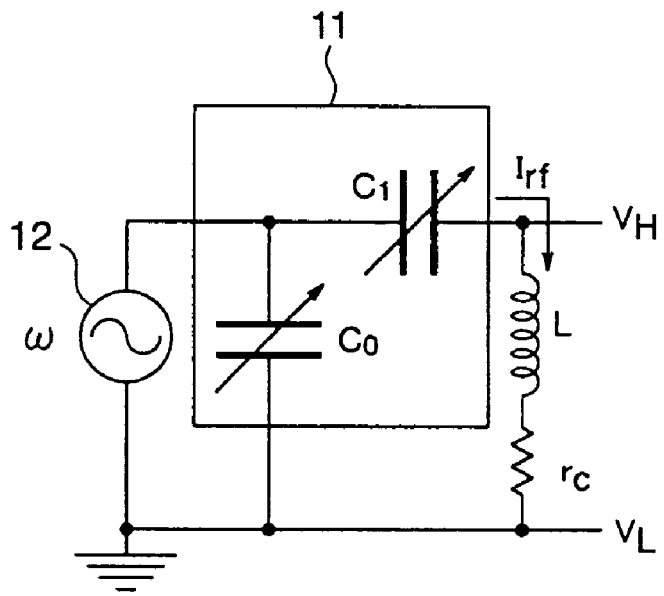
FIGS. 4A and 4B are an equivalent circuit diagram of a grounding type antenna and a floating type antenna.
Figure 4B:
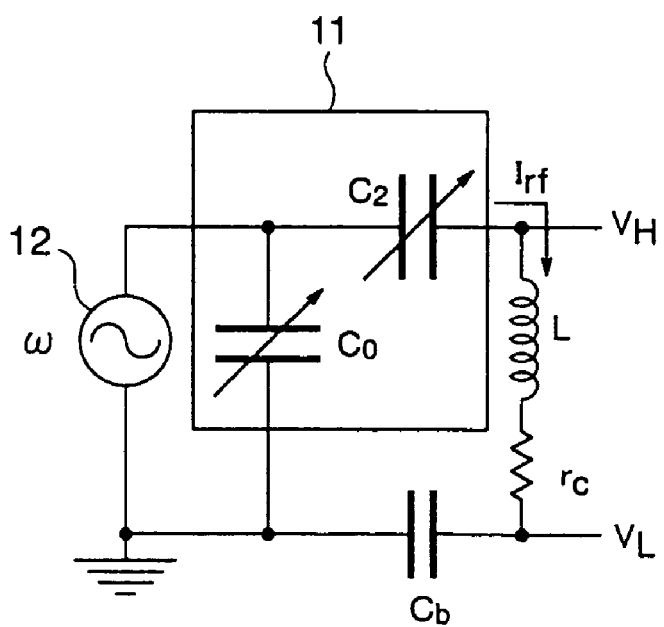

The blocking capacitor 7 is inserted between the ground side terminal of the high-frequency antenna 10 and the ground and high-frequency power is supplied to a drive side terminal via an impedance matching unit (or box) 11. FIG. 4A shows an equivalent circuit of a grounding type antenna directly connected to a ground potential and FIG. 4B shows an equivalent circuit of a floating type antenna connected to a ground potential via a capacitor. In these figures, the reference character L denotes the inductance of the antenna, the character $r_c$ the internal resistance of the antenna, the characters $C_0$, $C_1$, $C_2$ matching capacitors, the character $C_b$ a blocking capacitor, and ω the angular frequency of high-frequency current.

In both cases of FIGS. 4A and 4B, the high-frequency voltage occurring between the high potential side voltage $|V_H|$ and the low potential side voltage $|V_L|$ is given by the following equation (2) using the antenna current $I_{rf}$, the inductance of the antenna L, the internal resistance of the antenna $r_c$:

$$|V_H - V_L| = |j\omega L + r_c| I_{rf} \leq \omega L I_{rf} \qquad (2)$$

Furthermore, the internal resistance $r_c$ is small to such a negligible extent in metal antennas which are generally used. Therefore, the potentials $|V_L|$ and $|V_H|$ on both sides of a floating type antenna in which the blocking capacitor $C_b$ is connected to the terminal of the antenna, as shown in FIG. 4B, can be expressed by the following equations (3) and (4), respectively:

$$|V_L| = (1/\omega C_b) I_{rf} \qquad (3)$$

$$|V_H| = |1/j\omega C_b + j\omega L| I_{rf} \qquad (4)$$

When resonance conditions hold in FIGS. 4A and 4B, L and $C_0$ become as follows:

$$1/\omega^2 = [C_0 C_1/(C_0 + C_1)] L = C_1 L$$

Also, because in general, the input impedance in the impedance matching unit 11 is a low impedance of about 50 Ω, $C_0 >> C_1$ is satisfied. Furthermore, during the matching with the antenna, $1/C_1 = 1/C_2 + 1/C_b$ is satisfied. As a result, the voltage ratio at both ends of the floating type antenna shown in FIG. 4B can be expressed as follows:

$$|V_H/V_L| = C_b/C_2 \qquad (5)$$

The amplitude of the high-frequency voltage on the high potential side in the case of the grounding type antenna shown in FIG. 4A, in which the terminal of the antenna is directly connected to a ground, becomes $\omega L I_{rf}$ because the low potential side is fixed to the ground potential ($V_L = 0$ V).

In contrast to this, from Equation (2) and (5), the voltage of both ends of the floating type antenna of FIG. 4B becomes smaller than $\omega L I_{rf}$. And when the terminal capacity satisfies balance conditions and the ratio of $C_b$ to $C_2$ becomes 1, a minimum value $V_H = V_L = \omega L I_{rf}/2$ is obtained.

Figure 5A:
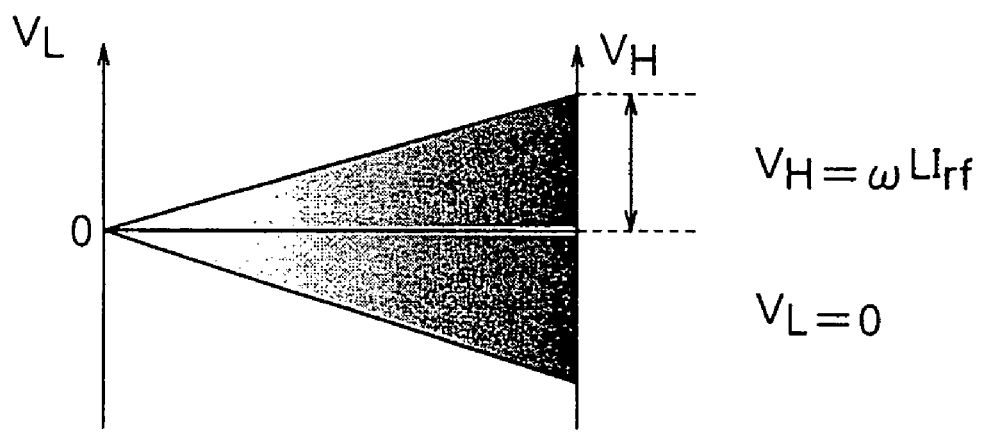
FIGS. 5A and 5B are views to explain the voltage distribution of a grounding type antenna and a floating type antenna.
Figure 5B:
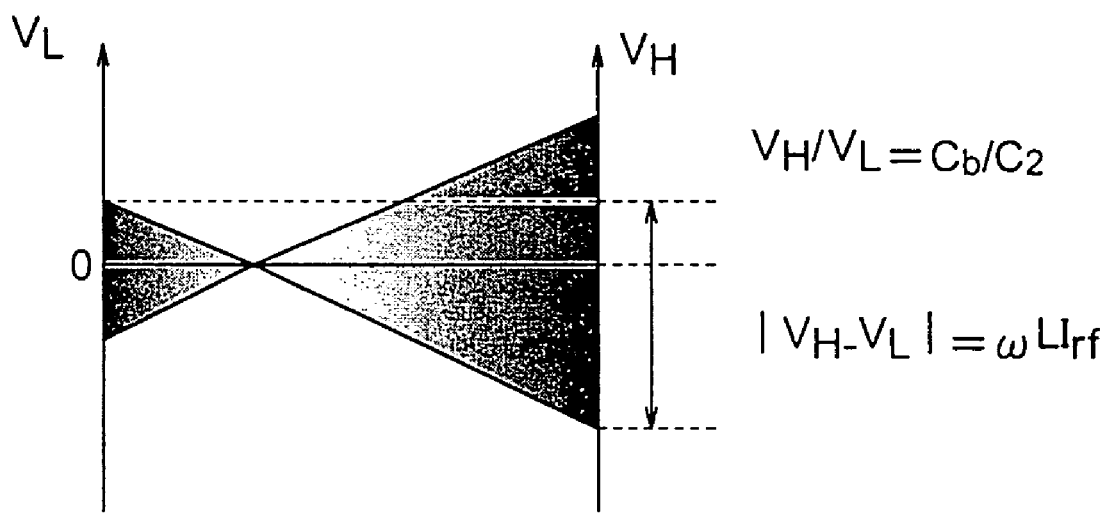

When a simple case where the leakage of high-frequency current to a plasma is negligible is supposed, as shown in FIGS. 5A and 5B, the high-frequency voltage which is distributed along the antenna conductor changes linearly from $V_L$ to $V_H$. In this case, in the floating type antenna shown in FIG. 5B in which the capacitor ($C_b$) is connected to the antenna terminal, the amplitude of the voltage $V_H$ on the high potential side of the antenna becomes half the amplitude ($\omega L I_{rf}$) in the case of the grounding type antenna shown in FIG. 5A, in which the antenna is directly connected to the ground potential, when the impedance of the antenna itself (L), the impedance of the matching capacitor ($C_2$) within the mating device and the impedance of the blocking capacitor ($C_b$) inserted between the antenna and the ground potential satisfies the following equation:

$$\omega L = 2/\omega C_b = 2/\omega C_2$$

Figure 10:
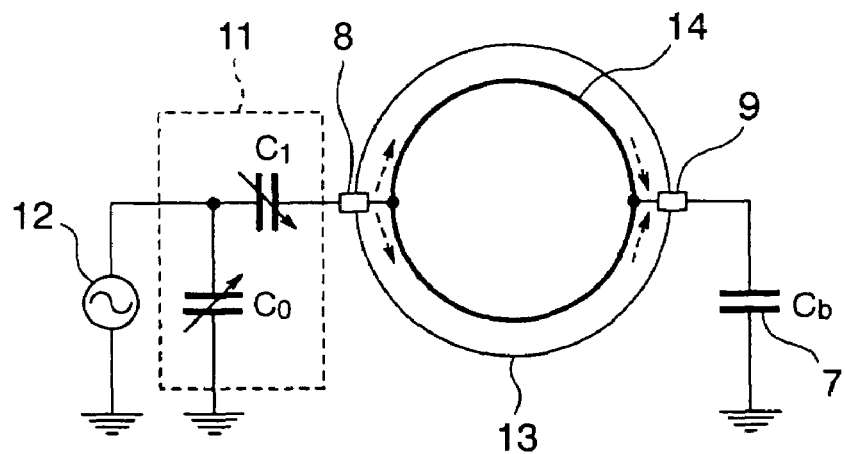
FIG. 10 is a configuration view of an embodiment of an antenna in which a ring-shaped conductor is used.

And as described above, the amplitude of the high-frequency voltage applied to the antenna can be substantially reduced by a combination of supplying a high-frequency current to the antenna of linear conductor which extends without going around and matching the impedance by inserting the capacitor into the terminal of the antenna. For example, in the case of an antenna of ring-shaped conductor (a double half-loop antenna) as shown in FIG. 10, as will be described later, the impedance becomes ½ compared to the case of the conventional type antenna in which the conductor extends going around by one turn. For this reason, the amplitude of the high-frequency voltage to ground becomes about ¼ that of the conventional method in which the ground side electrode is directly connected to the ground potential by use an antenna which extends in a go-around manner by one turn. This demonstrates that in a case where a voltage of the same degree as with the conventional method is allowed as the voltage amplitude to ground occurring in the antenna, it is possible to supply high-frequency power having a high output which is as high as 16 times that of the conventional method.

An embodiment of the apparatus of the present invention shown in FIG. 1 will be described below. In this apparatus, in the interior of a cylindrical vacuum container 400 mm in diameter and 200 mm in height, a high-frequency antenna 14 composed of a ring electrode 360 mm in diameter shown in FIG. 10 is attached as the antenna conductor 5 by being fixed to two lead-in terminals 8, 9 provided in the vessel side wall. And to one lead-in terminal 8 of the vessel side wall is connected a high-frequency power source (frequency: 13.56 MHz) 12 shown in FIG. 10 via the impedance matching unit 11. And the whole surface of this ring electrode is covered with the insulating tube 6 of high-purity alumina ceramics (99.6 at. %) having a wall thickness of 2 mm. In the selection of the material and thickness of the insulator, it is important to provide an impedance which is sufficiently larger than the equivalent impedance of the sheath (for example, larger by an order of magnitude at least) ($Z_{insulator} >> Z_{sheath}$). Moreover it is necessary that heat resistance, chemical stability, mechanical strength, electrical insulating properties, etc. which do not pose any problems even when the insulator is directly exposed to a plasma be provided. Therefore, materials of the group of ceramic dielectrics which simultaneously satisfy high resistance, high insulating properties and low dielectric constants, such as high-purity alumina, quartz and zirconia, are used and it is necessary only that the thickness of these materials be about 2 to 4 mm. And to the other lead-in terminal 9 is connected a capacitor (electrostatic capacity: 400 pF) and grounding is performed via this capacitor.

As shown in FIG. 10, the introduction terminals are arranged so as to be opposite to the ring-shaped electrode on a diametrical line in order to provide such a construction that high-frequency power is supplied from the two connection points on the diametrical line of the ring-shaped electrode (a double half-loop antenna). Owing to this method of supplying power, the inductance of the antenna is reduced compared to the case of the one-turn antenna having the same diameter and a go-around shape of the conventional method. When the inductance of the ring electrode (a full loop) used in this embodiment was measured, a value of about 1200 nH was obtained. When the inductance in a double half-loop structure was similarly measured, a value of 600 nH was obtained. Thus the inductance decreased by half.

Furthermore, a Langmuir probe for plasma measurement was introduced by use of an introduction flange of vessel side wall and the plasma condition was measured by this probe.

First, after the evacuation of the interior of the vacuum container to $1 \times 10^{-4}$ Pa by use of a vacuum pump, argon gas (Ar) was introduced from a gas inlet opening to 1.1 Pa, high-frequency power was input to 120 W to 2400 W, and a plasma was generated within the vacuum container. At that time, the plasma density in the central portion of the vacuum container (−65 mm from the surface where the antenna is installed) was measured by use of a Langmuir probe.

Also, in order to investigate the effect of the capacitor inserted on the ground side of the antenna, experiments were conducted in the case where the condenser was inserted (the floating type antenna) and in the case where the terminal of the antenna was directly connected to the ground potential (the grounding type antenna) and a comparison was made.

Figure 6:
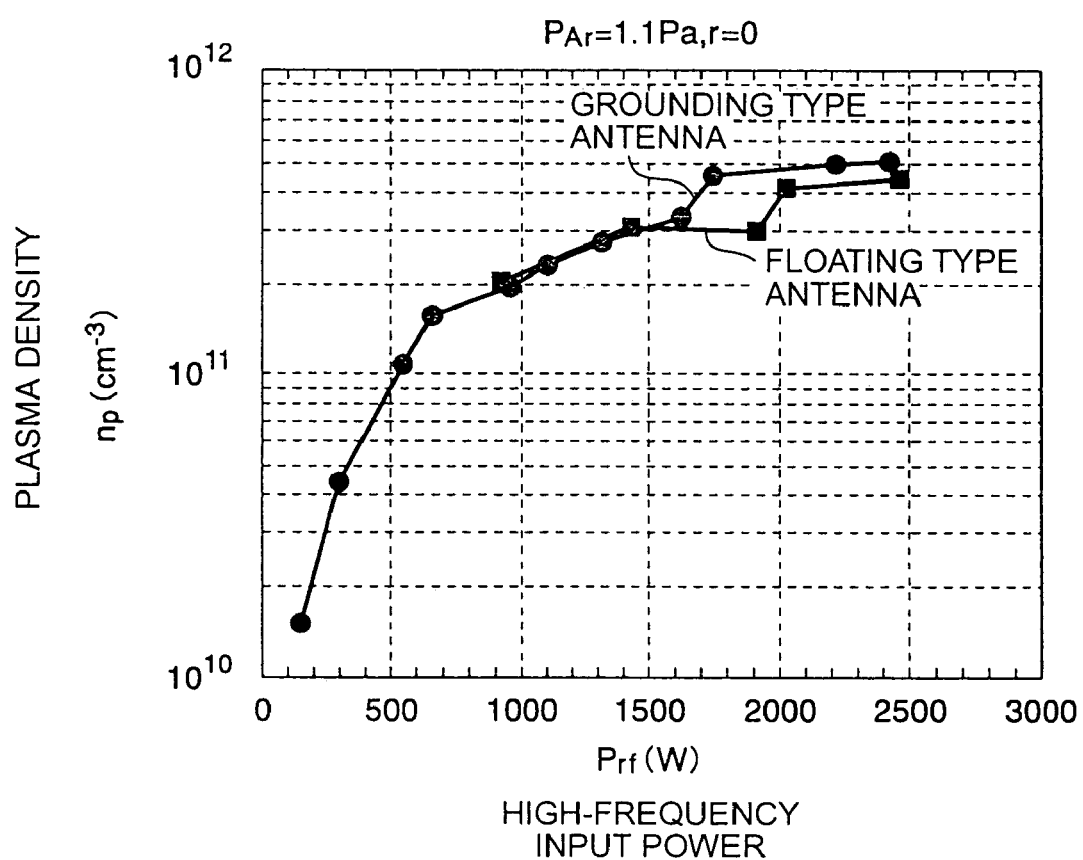
FIG. 6 is a graph showing the relationship between high-density input power and plasma density in a grounding type antenna and a floating type antenna.

FIG. 6 shows the relationship between high-density input power (Pr) and plasma density ($n_p$) in the antenna condition of each of a floating type antenna and a grounding type antenna. As shown in FIG. 6, in both of the floating type antenna and the grounding type antenna, $n_p$ increases with increasing $P_{rf}$ and a high-density plasma of charged particle density of $5 \times 10^{11}$ (cm$^{-3}$) is obtained at $P_{rf}$=2.4 kW. Therefore, it is apparent that there is no difference in $n_p$ due to the difference in the grounding condition of the antenna. Also, the plasma density obtained in this embodiment shows values equal to or higher than those obtained in a conventional plasma generator in which the discharge chamber diameter is not more than 300 mmφ. This demonstrates that a high-density plasma of a level that permits practical application can be easily obtained by the plasma generation method of the present invention even when the diameter is increased in comparison with the plasma generator of the conventional method.

Figure 7:
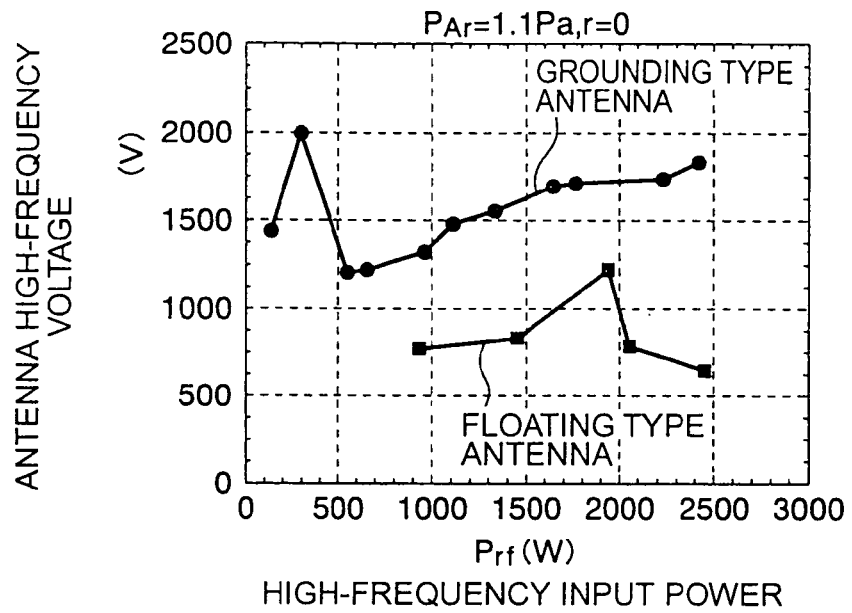
FIG. 7 is a graph showing changes in high-frequency voltage in a grounding type antenna and a floating type antenna.

Furthermore, FIG. 7 shows changes in high-frequency voltage ($V_{antenna}$) in each of the grounding type antenna and the floating type antenna, which were simultaneously measured by an oscilloscope. In the case of the grounding type antenna, $V_{antenna}$ also increases with increasing $P_{rf}$ in the region of $P_{rf}$ of not less than 500 W where $n_p$ becomes not less than $1 \times 10^{11}$ (cm$^3$). In contrast to this, in the case of the floating type antenna which satisfies the high-frequency balance conditions, the floating type antenna shows $V_{antenna}$ which are half or not more than those of the grounding type antenna. And when $P_{rf}$=2.5 kW, the grounding type antenna has $V_{antenna}$=about 1800 V, whereas the floating type antenna has $V_{antenna}$=about 600 V, which value is lowered to about ⅓ of the voltage of the grounding type antenna. From these results, it is apparent that the insertion of a capacitor which satisfies the high-frequency voltage balance conditions on the ground side of the antenna enables the value of voltage applied to the antenna to be reduced without lowering the plasma density, thereby making it possible to generate a stable high-density plasma by the input of large power.

By use of the same apparatus as in the embodiment of FIG. 1, a plasma was generated within the vacuum container by introducing argon gas (Ar) to 1.1 Pa, and putting high-frequency power to 120 W to 2400 W. In this case, the terminal of the antenna was directly connected to the ground potential. Furthermore, to examine the effect of the insulating film on the antenna surface, similar experiments were conducted in a case where the antenna surface is covered with an insulator and a case where the antenna surface is not covered with an insulator to make a comparison.

Figure 8:
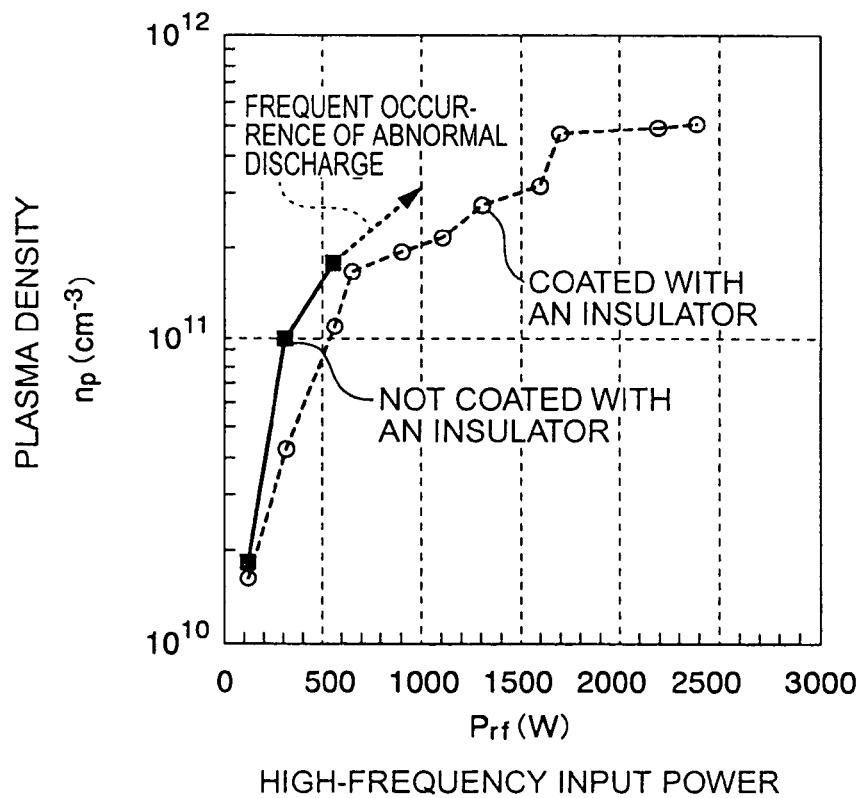
FIG. 8 is a graph showing the effect of an insulator coating on the antenna surface.

FIG. 8 shows changes in plasma density ($n_p$) ascribable to high-frequency input power ($P_{rf}$) in each antenna condition. In the case of the antenna condition without an insulator, plasma density ($n_p$) increases with increasing up to $P_{rf}$=500

W. However, at $P_{rf}$=500 W and more, abnormal discharge occurred frequently in every place within the vacuum container (for example, the lead-in terminals), and hence stable plasma cannot be provided. It might be thought that this is because the plasma potential increased abruptly as a result of an increase in plasma density, with the result that abnormal discharge occurred in every place within the vacuum container.

On the other hand, in the antenna coated with an insulator, $n_p$ increases with increasing $P_{rf}$ without causing abnormal discharge and a high-density plasma of $5 \times 10^{11}$ (cm$^{-3}$) is stably obtained at $P_{rf}$=2.4 kW. It might be thought that this is because electrons flowing from the plasma into the antenna are blocked by the coating of the antenna surface with the insulator, with the result that an increase in plasma potential is suppressed. Thus, it became apparent that a stable high-density plasma is obtained by coating the antenna surface with an insulator.

Figure 9A:
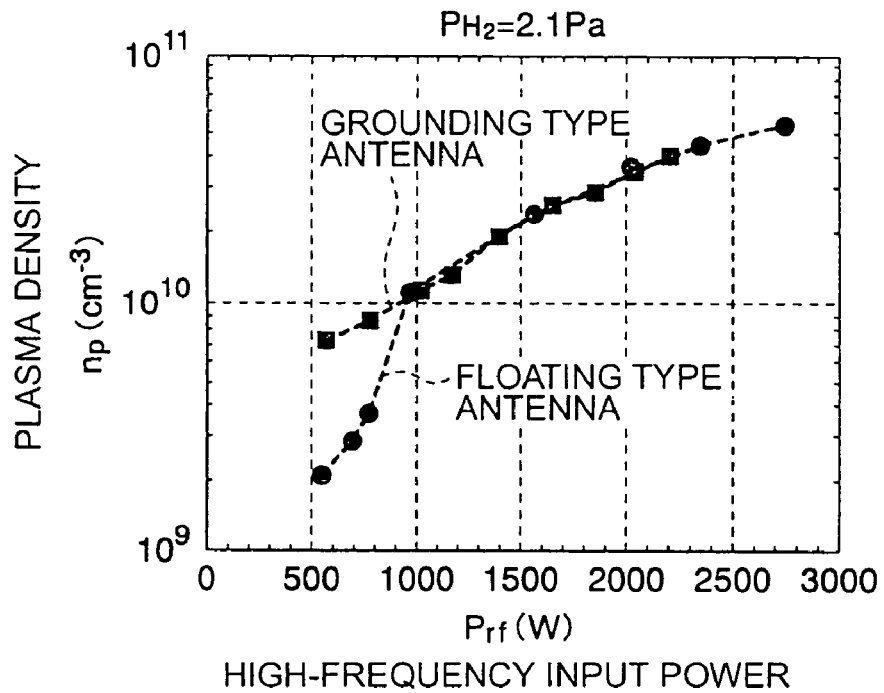
FIGS. 9A and 9B show the relationship between high-density input power and plasma density when hydrogen gas and nitrogen gas are used as an atmosphere gas.
Figure 9B:
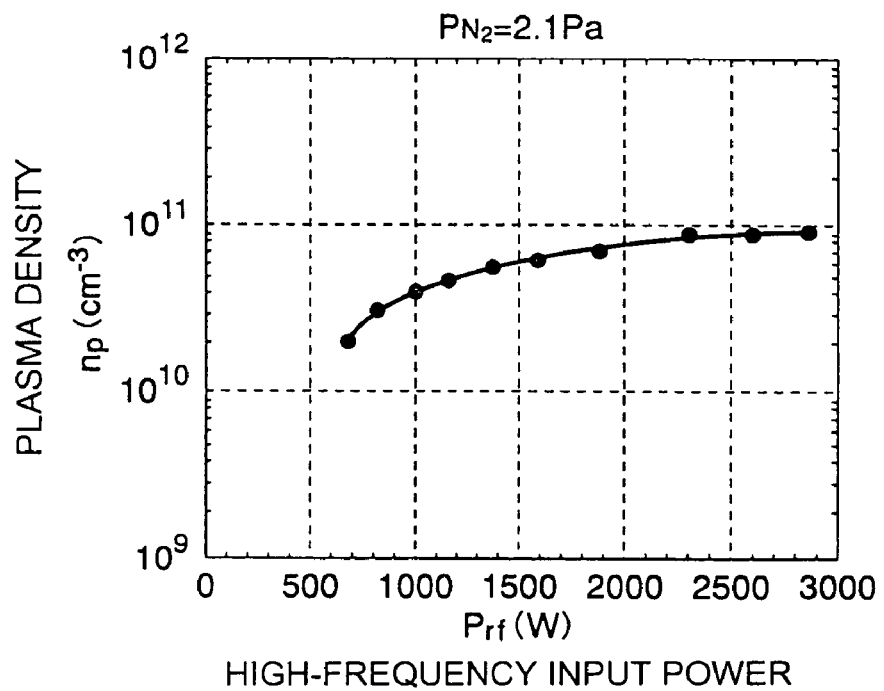

Incidentally, as the atmosphere gas introduced into the vacuum container of the plasma generator, in place of argon gas, hydrogen gas may be used as shown in FIG. 9A or nitrogen gas may be used as shown in FIG. 9B.

FIG. 9A shows the relationship between high-density input power ($P_{rf}$) and plasma density ($n_p$) in the antenna condition of each of a floating type antenna and a grounding type antenna when hydrogen gas is used as the atmosphere gas. As shown in FIG. 9A, in both of the floating type antenna and the grounding type antenna, $n_p$ increases with increasing $P_{rf}$ and a high-density plasma of charged particle density of $5 \times 10^{10}$ (cm$^{-3}$) is obtained at $P_{rf}$=2.3 kW. Therefore, it is apparent that there is no difference in $n_p$ due to the difference in the grounding condition of the antenna. FIG. 9B shows the relationship between high-density input power ($P_{rf}$) and plasma density ($n_p$) in a floating type antenna and when nitrogen gas is used as an atmosphere gas. As shown in FIG. 9B, $n_p$ increases with increasing $P_{rf}$ and a high-density plasma of charged particle density of $1 \times 10^{11}$ (cm$^3$) is obtained at $P_{rf}$=2.6 kW. This demonstrates that a high-density plasma of a level that permits practical application can be easily obtained by the plasma generation method of the present invention even when hydrogen gas or nitrogen gas is used as the atmosphere gas.

FIG. 10 shows an embodiment of an antenna in which a ring-shaped conductor is used. In FIG. 10, the numeral 13 denotes a cylindrical vacuum container shown in section, and the numeral 14 denotes a high-frequency antenna fabricated from a ring-shaped conductor disposed along the inner wall of the vacuum container 13. A connection point on the drive side and a connection point on the ground side are set at two terminal points of the diametrical line of the ring-shaped electrode. The high-frequency antenna 14 has such a construction that two symmetric semicircular linear conductors are connected in parallel at these two connection points. To the connection point on the drive side is supplied a high-frequency current from a high-frequency power source 12 via a impedance matching unit 11 and between the connection point on the ground side and a ground is inserted a blocking capacitor 7.

Figure 11:
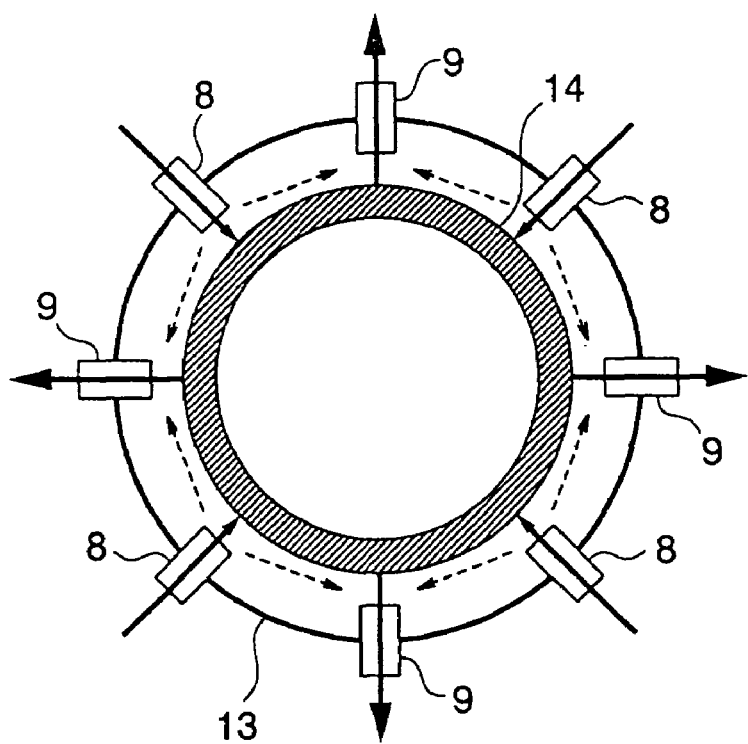
FIG. 11 is a configuration view of an embodiment of a ring-shaped multipole antenna.

Incidentally, a ring-shaped multipole antenna may be used as shown in FIG. 11 as the antenna provided within the vacuum container of the plasma generator instead of the ring-shaped conductor.

In FIG. 11, a ring-shaped multipole antenna is used in order to improve the nonuniformity of the azimuthal angle in a region of somewhat high pressure (not less than 1 Pa). In this case, a connection point is provided in each position where the ring-shaped conductor is divided into 8 equal parts (2n parts) by 4 (n) diametrical lines, and these connection points are set alternately on the connection points on the drive side and connection points on the ground side. Incidentally, the number of diametrical lines is not limited to 4 and a multiple lines such as 2, 3, 5 and 6 lines may be used. When attention is paid to one connection point, the high-frequency antenna 14 has such a construction that between two symmetric circular-arc frames are connected two adjacent connection points in parallel. Though not shown in the figure, in the same manner as in FIG. 9, a high-frequency current is supplied from a high-frequency power source 12 to the connection points on the drive side via a impedance matching unit 11 and between the connection points and the ground is inserted a blocking capacitor 7.

Figure 12:
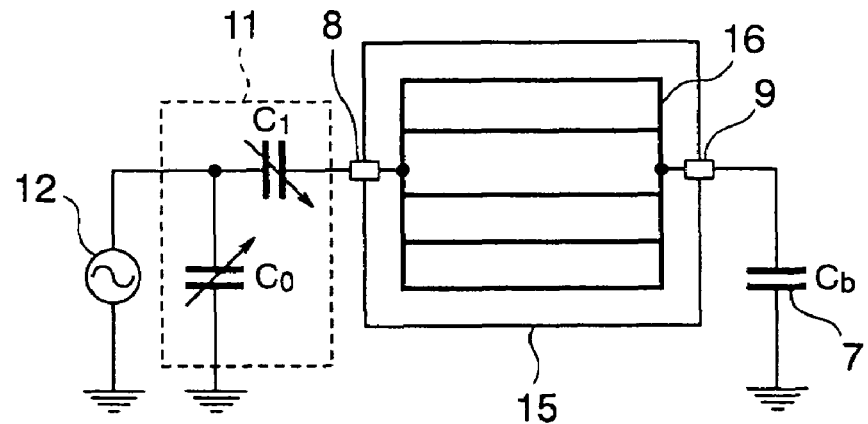
FIG. 12 is a configuration view of an embodiment of an antenna in which a fence-like conductor is used.
Figure 13:
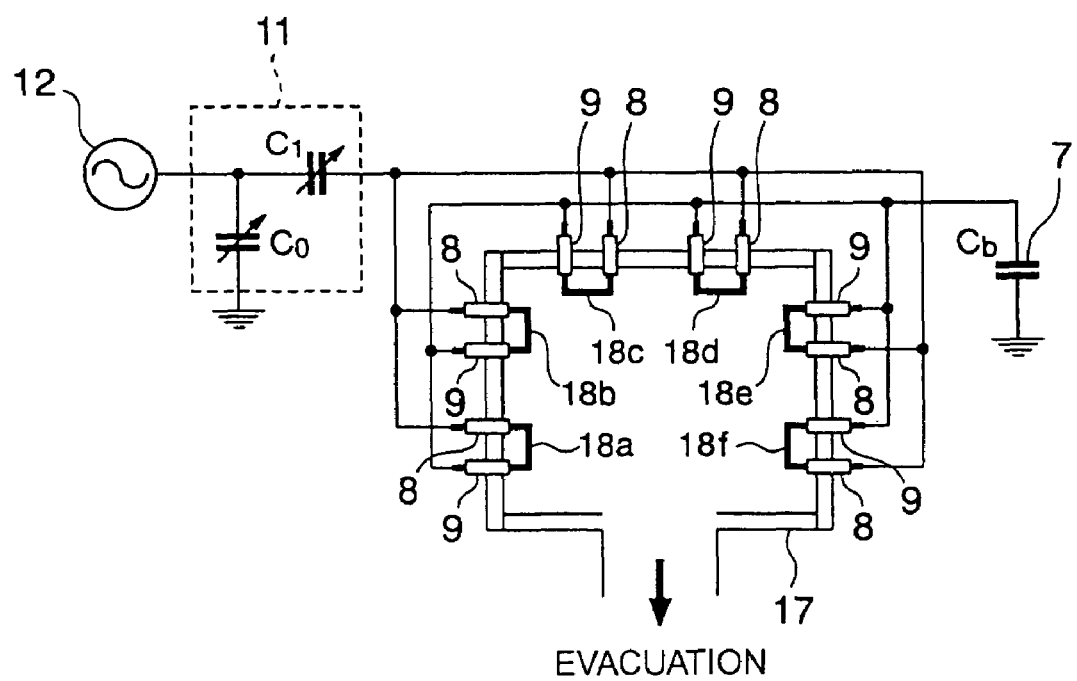
FIG. 13 is a configuration view of an embodiment of an antenna in which a plurality of linear conductors are used.
Figure 14:
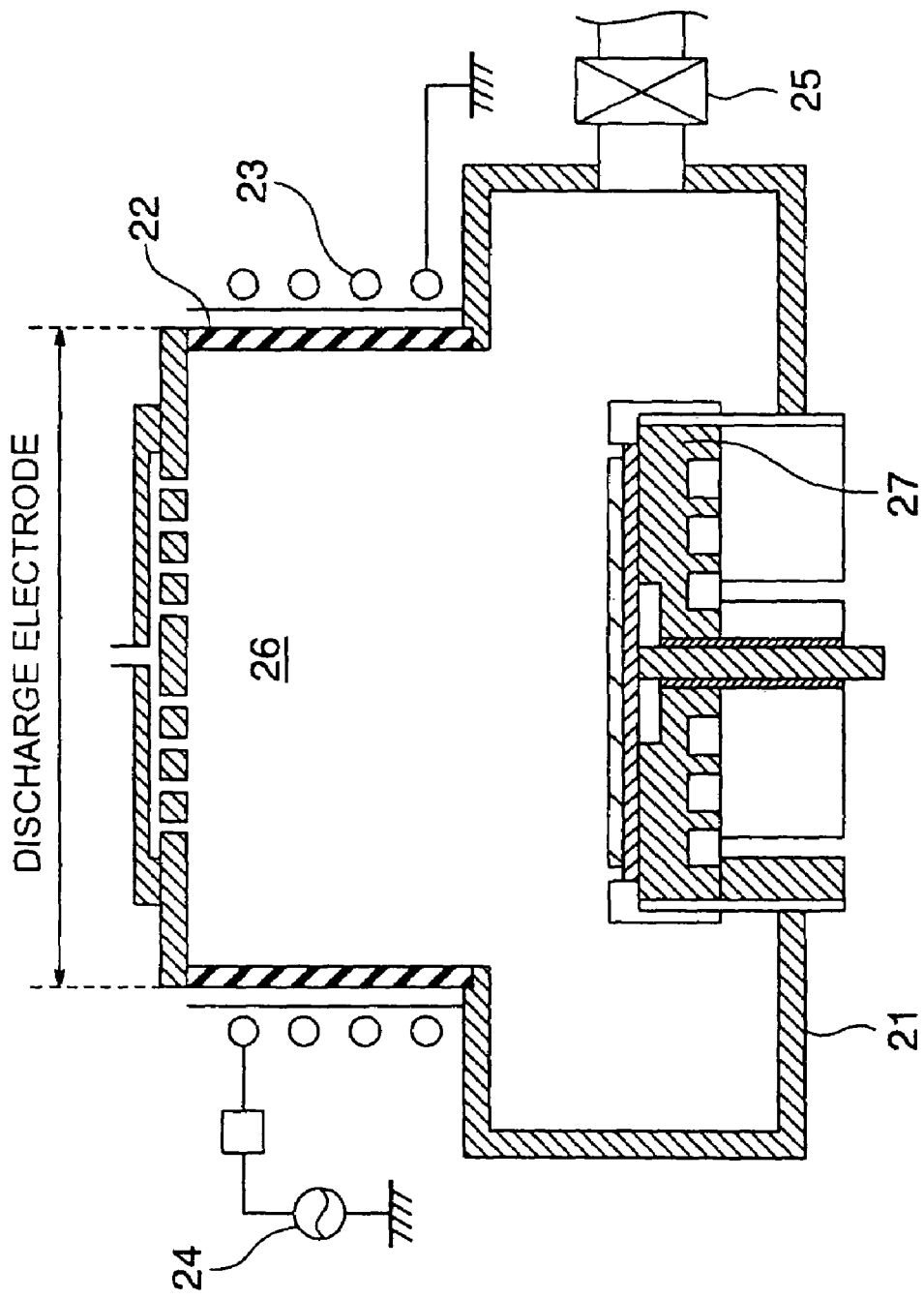
FIG. 14 is a configuration view showing an example of a conventional plasma processing apparatus which uses an ICP.

FIGS. 12 and 13 show modified embodiments of the apparatus shown in FIG. 3.

In a high-frequency antenna 16 in the embodiment of FIG. 12, a plurality of linear conductors are arranged in fence shape on the inner side of the high-frequency antenna 10 of FIG. 3 which is a rectangle as a whole. Although this high-frequency antenna of FIG. 12 has substantially the same function as in the case of the embodiment of FIG. 10, this high-frequency antenna is especially effective in generating a high-density plasma within a vacuum container 15 having a rectangular section, because it is possible to cause a high-frequency current to flow trough a plurality of linear conductors in parallel.

Also, the embodiment shown in FIG. 13 is a multi-type linear antenna in which a plurality of linear antennas 18a to 18f are arranged longitudinally, crosswise or two-dimensionally along the inner wall surface of a vacuum container 17. Each of the linear antennas 18a to 18f is connected in parallel outside the vacuum container 17 and a impedance matching unit 11 and a blocking capacitor 7 are connected. The embodiment of FIG. 13 has substantially the same function as the embodiment of FIG. 10, with the exception that this embodiment of FIG. 13 is a multi-type linear antenna. However, this embodiment is especially effective in generating a high-density plasma within a large-diameter, long-axis vacuum container. Incidentally, it is also possible to change each of the linear antennas 18a to 18f to an antenna in Π-shaped form or circular arc form as required.

Furthermore, in the embodiments of FIGS. 3, 10, 11, 12, 13, etc., the uniformity of plasma density can be further improved by adding appropriate magnetic field generating means, for example, by attaching a multicusp-type permanent magnet along the outer wall of the vacuum container.

INDUSTRIAL APPLICABILITY

Because in the present invention, the antenna itself for generating a plasma is provided within the vacuum container, the plasma generator is not limited by the shape, diameter or length of the discharge chamber. Furthermore, by covering the whole surface of the antenna conductor with an insulator, it is possible to generate a large-diameter, large-volume, high-density plasma in a stable manner.

Furthermore, because in the present invention an increase in inductance associated with large antenna design is suppressed, by using a linear antenna which does not extend in a go-around manner and besides by performing matching by inserting a capacitor of fixed or variable electric capacity between the terminal of the antenna and the ground, a plasma of high density and low plasma potential is generated, with the result that plasma processing which causes less damage can be realized and large high-frequency power can be supplied. Therefore, it is easy to raise the density of a plasma.

The invention claimed is:

1. A plasma generator for generating inductive coupling plasma by high-frequency discharge, comprising:
    a vacuum container having an inner wall surface which includes a plurality of planes on said inner wall surface; and
    an antenna generating an induction field by applying high-frequency power, said antenna being provided within said vacuum container and including a plurality of conductors, said plurality of conductors divided into a plurality of groups each of which corresponds to any one of said plurality of planes, each of said plurality of conductors being disposed along the inner wall surface, and being connected in parallel with each other at outside of said vacuum container, and said conductor of the similar group starting and terminating at the similar plane of the plurality of planes to which the group corresponds.

2. A plasma generator according to claim 1, further comprising:
    a magnetic field generating unit making a plasma density uniform and provided outside of said vacuum container.

3. A plasma generator according to claim 1, further comprising:
    a capacitor of fixed or variable electric capacity inserted between a connection point near a ground of said antenna and said ground.

4. A plasma generator according to claim 1, wherein any one of argon gas, hydrogen gas and nitrogen gas is used as an atmosphere gas introduced into the vacuum container.

5. A plasma generator according to claim 1, wherein a section of said vacuum container is rectangular, and each of said plurality of conductors are arranged along said inner wall surface having a shape of rectangular.

* * * * *